United States Patent [19]
Kinoshita et al.

[11] Patent Number: 6,110,834
[45] Date of Patent: Aug. 29, 2000

[54] SEMICONDUCTOR DEVICE AND MANUFACTURING METHOD THEREOF FOR REMOVING REACTION PRODUCTS OF DRY ETCHING

[75] Inventors: Takatoshi Kinoshita; Hiroshi Kadowaki, both of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 09/070,914

[22] Filed: May 4, 1998

[30] Foreign Application Priority Data

Oct. 29, 1997 [JP] Japan ................................... 9-297167

[51] Int. Cl.[7] ................................................ H01L 21/302
[52] U.S. Cl. .............................. 438/706; 438/725; 216/41
[58] Field of Search ................................... 438/706, 714, 438/719, 725; 134/95; 216/41, 67

[56] References Cited

U.S. PATENT DOCUMENTS

| | | | |
|---|---|---|---|
| 4,123,564 | 10/1978 | Ajima et al. | 427/85 |
| 4,585,515 | 4/1986 | Maa | 156/643 |
| 5,443,998 | 8/1995 | Meyer | 437/241 |
| 5,920,767 | 7/1999 | Horie et al. | 438/40 |

FOREIGN PATENT DOCUMENTS

| | | |
|---|---|---|
| 53-47766 | 4/1978 | Japan . |
| 58-30135 | 2/1983 | Japan . |
| 3-218629 | 9/1991 | Japan . |
| 8-250400 | 9/1996 | Japan . |

OTHER PUBLICATIONS

"Jap. J. Appl. Phys. 35 (4A) pt1, 1989–1992 "(1996).
"Proc Electrochem Soc. 95–20;p. 6065 "(1996).

*Primary Examiner*—Benjamin L. Utech
*Assistant Examiner*—Kin-Chan Chen
*Attorney, Agent, or Firm*—McDermott, Will & Emery

[57] ABSTRACT

Reaction products due to etching of a semiconductor sample by using a reactive gas are removed by using a liquid chemical that contains sulfuric acid and hydrofluoric acid at a volume mixing ratio of (5 to 7):(1/400 to 1/1000) and is kept at 25°–70° C. Reaction products and a resist mask are removed simultaneously by using a liquid chemical that contains sulfuric acid, a hydrogen peroxide solution, and hydrofluoric acid at a volume mixing ratio of (5 to 7):1:(1/400 to 1/1000) and is kept at 70°–100° C.

15 Claims, 4 Drawing Sheets

SEMICONDUCTOR DEVICE AND MANUFACTURING METHOD THEREOF FOR REMOVING REACTION PRODUCTS OF DRY ETCHING

BACKGROUND OF THE INVENTION

1. Field of the Invention

The present invention relates to a manufacturing method of a semiconductor device which includes a wet etching step for removing reaction products of dry etching from a semiconductor wafer or simultaneously removing reaction products together with a resist mask.

2. Background Art

For example, Japanese Patent Application Laid-Open No. 49-10746 discloses a conventional technique of cleaning a silicon wafer with a mixed liquid of sulfuric acid, a hydrogen peroxide solution, and hydrofluoric acid. However, this publication does not disclose any technique for removing reaction products of dry etching and a resist mask.

For example, Japanese Patent Application Laid-Open Nos. 4-142741 (publication (1)), 7-99178 (publication (2)), and 8-339996 (publication (3)) disclose techniques of removing a resist mask and reaction products produced by dry etching of a silicon oxide film or a polysilicon film on a silicon substrate. Specifically, publication (1) relates to a technique of removing adherent particles, publication (2) relates to a technique of removing a layer that has been damaged by dry etching, and publication (3) relates to a technique of removing minute foreign substances by wet etching. That is, publication (1) discloses a wet etching technique that uses, in turn, sulfuric acid/hydrogen peroxide solution, pure water, hydrogen peroxide solution/aqueous ammonia, and pure water. Publication (2) discloses a wet etching technique that uses, in turn, hydrofluoric acid, sulfuric acid/hydrogen peroxide solution, and hydrofluoric acid. Publication (3) discloses a wet etching technique that uses, in turn, a buffer ammonium fluoride solution, sulfuric acid/hydrogen peroxide solution, hydrofluoric acid, and pure water.

As described above, conventionally, respective materials to be etched such as organic materials, silicon-type materials, and oxide films or for respective, various kinds of substances to be removed are separately removed by using respective liquid chemicals. Therefore, many kinds of liquid chemicals are used in large quantities. Because of a multi-bath process in which a substrate is sequentially immersed in different liquid chemicals, the number of steps is large and the processing time is long. Further, it is necessary to switch, many times, between vacuum equipment for dry etching and chemical equipment for wet etching, which complicates the manufacture and quality management.

Further, conventionally, there is no proper method for removing only various kinds of reaction products while leaving a resist mask to use it in later steps or simultaneously removing various kinds of reaction products and a resist mask by a single liquid chemical or a single wet etching step. It is now desired to develop such a method.

SUMMARY OF THE INVENTION

The present invention has been made to solve the above problems, and an object of the invention is therefore to provide a manufacturing method of a semiconductor device which can remove only reaction products of dry etching or reaction products and a resist mask by use of a small amount of liquid chemical.

According to one aspect of the present invention, in a manufacturing method of a semiconductor device, a resist pattern is applied to a silicon-type semiconductor sample, and dry etching in performed on the semiconductor sample by using a reactive gas. Thereafter, reaction products that have been produced by the dry etching and is adhering to the semiconductor sample are removed by cleaning the semiconductor sample with a first liquid chemical containing sulfuric acid and hydrofluoric acid.

In another aspect of the present invention, in the manufacturing method of a semiconductor, the first liquid chemical contains sulfuric acid and hydrofluoric acid at a volume mixing ratio of (5 to 7):(1/400 to 1/1000) and is kept at a temperature in the range of 25°–70° C.

According to another aspect of the present invention, in a manufacturing method of a semiconductor device, a resist pattern is applied to a silicon-type semiconductor sample, and dry etching is performed on the semiconductor sample by using a reactive gas. Thereafter, the resist pattern and reaction products that have been produced by the dry etching and is adhering to the semiconductor sample are removed by cleaning the semiconductor sample with a second liquid chemical containing sulfuric acid, a hydrogen peroxide solution, and hydrofluoric acid.

In another aspect of the present invention, in the manufacturing method of a semiconductor device, the second liquid chemical contains sulfuric acid, the hydrogen peroxide solution, and hydrofluoric acid at a volume mixing ratio of (5 to 7):1:(1/400 to 1/1000) and is kept at a temperature in the range of 70°–100° C.

In the manufacturing methods of a semiconductor device, a material to be etched by the dry etching is selected from the group consisting of single crystal silicon, polysilicon, amorphous silicon, silicide, polycide, silicon oxide, silicon nitride, and silicon oxynitride.

Further, in the manufacturing method of a semiconductor device, the reactive gas for the dry etching is a gas selected from the group consisting of HBr, $Br_2$, $Cl_2$, $CF_4$, $CHF_3$, $CH_2F_2$, and $C_2F_6$.

Other and further objects, features and advantages of the invention will appear more fully from the following description.

BEST MODE OF CARRYING OUT THE INVENTION

Figure 1:
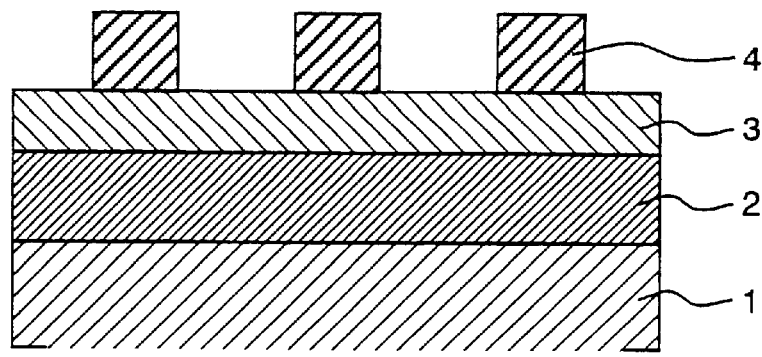
FIGS. 1A, 1B, and 1C show a manufacturing process in a manufacturing method of a semiconductor device according to a first embodiment of the present invention.
Figure 1:
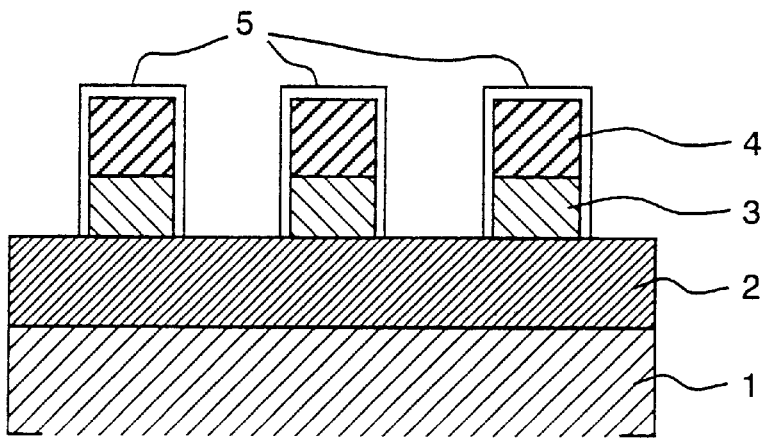
Figure 1:
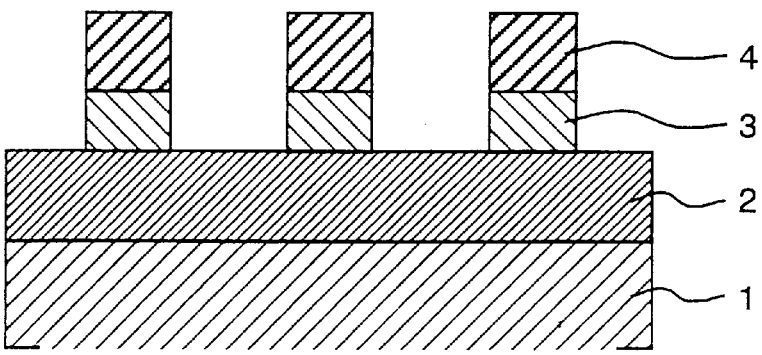
Figure 2:
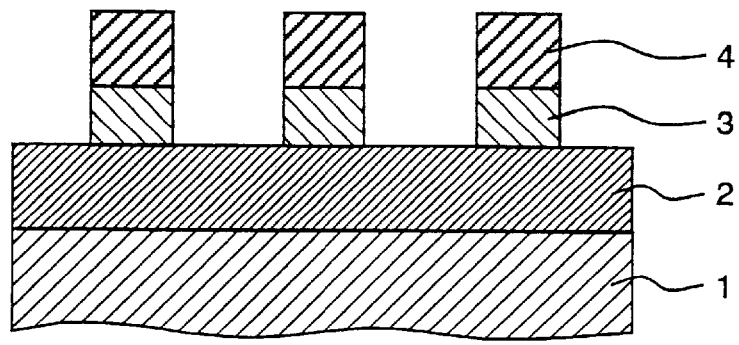
FIGS. 2A, 2B, and 2C show a manufacturing process in a manufacturing method of a semiconductor device according to a second embodiment of the present invention.
Figure 2:
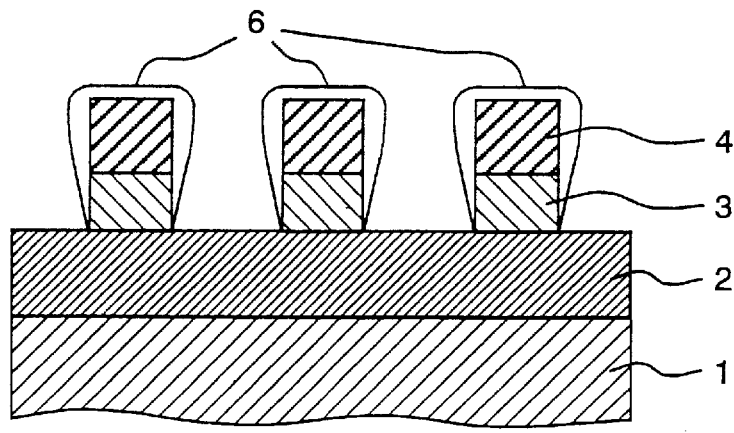
Figure 2:
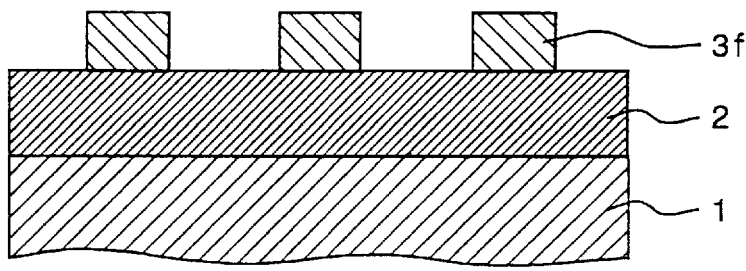
Figure 3:
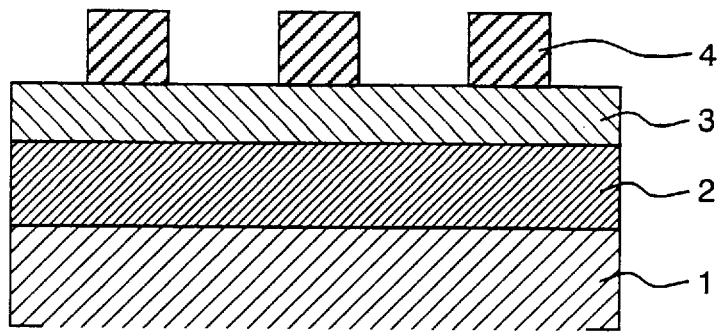
FIGS. 3A, 3B, and 3C show another manufacturing process in a manufacturing method of a semiconductor device according to a second embodiment of the present invention.
Figure 3:
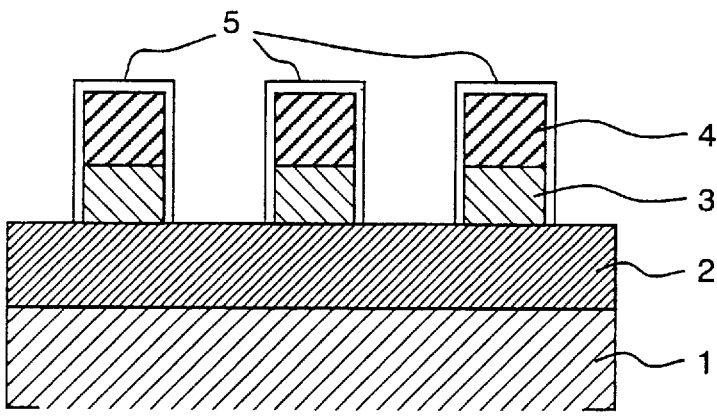
Figure 3:
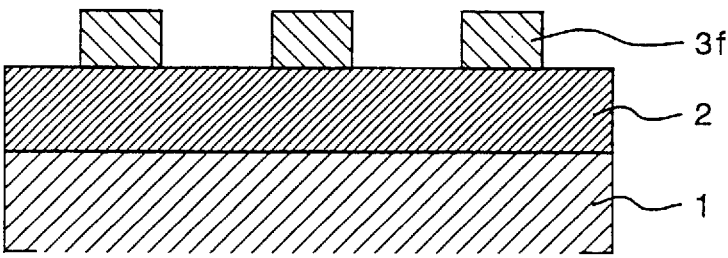

Embodiments of the present invention will be hereinafter described with reference to FIGS. 1A, 1B, and 1C to FIG. 4. The same reference symbols in the drawings denote the same or corresponding parts.

First Embodiment

FIGS. 1A, 1B, and 1C are process diagrams for description of a manufacturing method of a semiconductor device according to a first embodiment of the present invention. In the first embodiment, a liquid chemical is selected so that only reaction products of dry etching are removed while a resist mask is left.

FIGS. 1A, 1B, and 1C are schematic sectional views showing states before the start of first dry etching, after the end of the first dry etching, and after the end of first wet etching, respectively.

First, as shown in FIG. 1A, a silicon oxide ($SiO_2$) film 2 of, for instance, 1,000 nm in thickness is formed on the surface of a silicon substrate 1 by thermal oxidation. A 300-nm-thick polysilicon film 3 as, for instance, a wiring electrode material is deposited on the silicon oxide film 2 by chemical vapor deposition (CVD). Further, a photoresist of about 1,000 nm in thickness is applied to the polysilicon film 3 by spin coating, and then patterned into a resist mask 4 as an etching mask for forming wiring electrodes by photolithography (exposure and development).

For example, the photoresist may be a positive, chemically amplified resist material XP8843 (manufactured by Replay, Inc.) or a photoresist OMR-83 (manufactured by Tokyo Ohka Kogyo Co., Ltd.).

In the invention the state of a semiconductor wafer before formation of a resist pattern for dry etching is not limited to that shown in FIG. 1A, and such states will be hereinafter called generically "semiconductor sample."

Then, the semiconductor wafer shown in FIG. 1A is mounted in reactive ion etching (RIE) vacuum equipment (not shown), and first dry etching (anisotropic) of the polysilicon film 3 is performed through the resist mask 4.

The reaction gas of the dry etching is such that an oxygen gas ($O_2$) is added to a mixed gas of halogen gases, i.e., a hydrogen bromide gas (HBr) and a chlorine gas ($Cl_2$). Where an oxygen gas is added, $SiO_2$ is additionally produced as a redecomposition product of a reaction product $SiBr_y$ of a reaction with silicon according to the following formula:

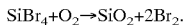

$$SiBr_4+O_2 \rightarrow SiO_2+2Br_2.$$

And the thus-produced $SiO_2$ adheres to the resist mask 4, to restrain etching of the resist mask 4 As a result, the selective etching ratio of the polysilicon film 3 to the resist mask 4 is greatly increased.

In the dry etching step using the reactive gas, $SiCl_4$ and $SiBr_x$ are produced by reactions with silicon, $SiO_x$ is produced by an oxidizing reaction, and organic substances containing C (main component), H, O, and N are produced by reactions with the resist material and other organic substances. The above and other reaction products are deposited on the semiconductor wafer as reaction products 5. The reaction products 5 are mainly deposited, as residues, on the surfaces of the side walls of the resist mask 4 and the polysilicon film 3. As shown in FIG. 1B, a timing control is so made that the dry etching is finished when the silicon oxide film 2 is just exposed.

Then, the semiconductor wafer of FIG. 1B is moved into etching chemical equipment (not shown), where first wet etching is performed to remove the unnecessary reaction products 5 that are deposited on the semiconductor wafer. In this wet etching, the semiconductor wafer is immersed for 6 minutes in a mixed liquid of sulfuric acid and hydrofluoric acid (6:1/600 in volume mixing ratio) that is kept at 25° C.

In the wet etching step using the above liquid chemical, as shown in FIG. 1C, only the reaction products 5 that are deposited on the surfaces of the side walls etc. of the resist mask 4 and the polysilicon film 3 as residues are removed while the resist mask 4 is left as it is in a desired state. The resist mask 4 can be reused as a mask for second wet etching in a later step.

Among the reaction products 5, oxide films and silicon-type substances containing $SiO_2$ (main component) and $Si_xBr_y$ react with hydrofluoric acid and are thereby dissolved and removed. Further, among the reaction products 5, organic substances containing C (main component), H, O, and N react with sulfuric acid and are thereby dissolved and removed.

With an additional favorable effect of protection by $SiO_2$-type reaction products 5 formed on the resist mask 4, the resist mask 4 is not dissolved if the liquid chemical is at the normal temperature. To ensure that there will not occur any problem in reuse as a mask, it is desired that the liquid temperature be lower than or equal to 70° C.

To determine a proper mixing ratio of the liquid chemical used in the first embodiment, that is, to find conditions under which only the dry etching reaction products 5 are removed and the resist mask 4 is left, experiments were performed while the mixing ratio between sulfuric acid and hydrofluoric acid was varied over a wide range in the steps of FIGS. 1B and 1C.

The surface states of sample wafers were evaluated by using various measuring methods such as identifying organic reaction products through observation of infrared characteristic absorption bands.

Experimental results showed that where the liquid temperature is in a range of the normal temperature (for instance, 25° C.) to 70° C., a favorable result is obtained in a volume mixing ratio between sulfuric acid and hydrofluoric acid of (5 to 7) :(1/400 to 1/1000). This liquid chemical will be hereinafter called "first liquid chemical." It was also found that the most favorable result is obtained in a volume mixing ratio between sulfuric acid and hydrofluoric acid of 6:(1/400 to 1/1000).

In the first liquid chemical, if the volume ratio is such that sulfuric acid amounts to 5 to 7 and hydrofluoric acid amounts to smaller than 1/1000, particularly smaller than 1/1500, the removability of oxide films mainly made of $SiO_2$ among the reaction products 5 is low, whereby the necessary immersion time becomes unduly long, i.e., exceeds a prescribed allowable time. On the other hand, if hydrofluoric acid amounts to larger than 1/400, particularly larger than 1/300, the mirror-finishing performance of the wafer surface is lowered to a level out of the allowable quality limit. The allowable range of the mixing ratio of the first liquid chemical was determined for the above reasons.

As described above, according to the first embodiment, a liquid chemical treatment can be performed effectively in such a manner that only unnecessary dry etching reaction products are removed from a semiconductor sample such as a semiconductor wafer while a resist mask is left there.

Further, since reactions occur continuously or simultaneously, the amounts of liquid chemicals and the processing time can be reduced.

Second Embodiment

FIGS. 2A, 2B, and 2C are process diagrams for description of a manufacturing method of a semiconductor device according to a second embodiment of the invention. In the second embodiment, a liquid chemical is selected so that a resist mask is removed together with dry etching reaction products.

FIGS. 2A, 2B, and 2C are schematic sectional views showing states before the start of second dry etching, after the end of the second dry etching, and after the end of second wet etching, respectively.

FIG. 2A shows the state before the start of the second dry etching, i.e., a state that the semiconductor wafer of FIG. 1C is moved into RIE vacuum equipment (not shown). In this state, isotropic etching on the polysilicon films 3 is started with the resist mask 4 used as a second mask. The reaction gas for the second dry etching is a mixed gas of HBr and $Cl_2$ (as used in the first embodiment) that does not contain an oxygen gas.

In the dry etching step using the reactive gas, $SiCl_4$ and $SiBr_x$ are produced by reactions with silicon, $SiO_x$ is produced by an oxidizing reaction, and organic substances containing C (main component), H, O, and N are produced by reactions with the resist material and other organic substances. The above and other reaction products are deposited on the semiconductor wafer as reaction products 6. The reaction products 6 are deposited, as residues, on the surfaces of the side walls etc. of the resist mask 4 and the polysilicon films 3. As shown in FIG. 2B, a control is so made that the dry etching is finished when the width of the polysilicon films 3 is reduced by a desired amount.

Then, the semiconductor wafer of FIG. 2B is moved into etching chemical equipment (not shown), where second wet etching is performed to remove the unnecessary reaction products 6 deposited on the semiconductor wafer as well as the resist mask 4. In this wet etching, the semiconductor wafer is immersed for 2 minutes in a mixed liquid of sulfuric acid, a hydrogen peroxide solution, and hydrofluoric acid (6:1:1/600 in volume mixing ratio) that is kept at 100° C.

Both of the resist mask 4 and the reaction products 6 that are deposited on the surfaces of the side walls etc. of the polysilicon films 3 and the resist mask 4 (see FIG. 2B) are removed simultaneously by the single step of immersion into a liquid chemical, to obtain a desired state in which no unnecessary reaction products adhere to wiring electrodes 3f (see FIG. 2C).

Oxidation of organic substances among the reaction products 6 is accelerated by the action of the hydrogen peroxide solution in the mixed liquid, and the oxidized organic reaction products and the resist mask 4 are effectively dissolved and removed by sulfuric acid having a strong reducing effect on organic substances. Oxide films and silicon-type substances among the reaction products 6 are dissolved and removed by hydrofluoric acid while the oxidation is accelerated by the action of the hydrogen peroxide solution. Since the immersion time necessary for the dissolution and removal increases as the liquid temperature decreases, it is desirable that the liquid temperature be kept higher than or equal to 70° C.

To determine a proper mixing ratio of the liquid chemical used in the second embodiment, that is, to find conditions under which the resist mask 4 is removed together with the dry etching reaction products 6, experiments were performed while the mixing ratio among sulfuric acid, a hydrogen peroxide solution, and hydrofluoric acid was varied over a wide range in the steps of FIGS. 2B and 2C. The methods for identifying various reaction products such as organic substances on sample wafers and evaluating the surface states were the same as in the first embodiment.

Experimental results showed that where the liquid temperature is in a range of 70°–100° C., a favorable result is obtained in a volume mixing ratio among sulfuric acid, a hydrogen peroxide solution, and hydrofluoric acid of (5 to 7):1:(1/400 to 1/1000). This liquid chemical will be hereinafter called "second liquid chemical." It was also found that the most favorable result is obtained in a volume mixing ratio among sulfuric acid, a hydrogen peroxide solution, and hydrofluoric acid of 6:1:(1/400 to 1/1000).

In the second liquid chemical, if the volume ratio of sulfuric acid with respect to a hydrogen peroxide solution (ratio: 1) is smaller than the range of 5 to 7, the removability of the resist mask 4 is low, whereby the necessary immersion time becomes unduly long, i.e., exceeds a prescribed allowable time. On the other hand, if the volume ratio of sulfuric acid is larger than 7, the removability of oxide film type reaction products 6 is low though that of the resist mask 4 is high, whereby the necessary immersion time also becomes unduly long, i.e., exceeds the prescribed allowable time.

Further, in the second liquid chemical, if the volume ratio of hydrofluoric acid with respect to a hydrogen peroxide solution (ratio: 1) is smaller than 1/1000, particularly smaller than 1/1500, the removability of oxide films mainly made of $SiO_2$ among the reaction products 6 is low, whereby the necessary immersion time becomes unduly long, i.e., exceeds a prescribed allowable time. On the other hand, if the volume ratio of hydrofluoric acid is larger than 1/400, particularly larger than 1/300, the mirror-finishing performance of the wafer surface is lowered to a level out of the allowable quality limit. The allowable range of the mixing ratio of the second liquid chemical was determined for the above reasons.

Next, FIGS. 3A, 3B, and 3C are process diagrams for description of another case in which the etching method of the second embodiment is applied. FIGS. 3A–3C are schematic sectional views showing states before the start of dry etching, after the end of the dry etching, and after the end of wet etching, respectively.

Since the steps of FIGS. 3A and 3B are similar to the steps of FIGS. 1A and 1B, detailed descriptions there for are omitted.

The semiconductor wafer of FIG. 3B is moved into etching chemical equipment (not shown), where wet etching is performed to remove not only the unnecessary reaction products 5 deposited on the semiconductor wafer but also the resist mask 4. This step is not described in detail because it is similar to the steps of FIG. 2B and 2C of the second embodiment.

As a result, a desired state in which no unnecessary reaction products adhere to wiring electrodes 3f is obtained as shown in FIG. 3C.

As described above, according to the second embodiment, a liquid chemical treatment can be performed effectively in such a manner that unnecessary dry etching reaction products and a resist mask that will not be used in the next step are removed simultaneously from a semiconductor sample such as a semiconductor wafer.

Further, since reactions occur continuously or simultaneously, the amounts of liquid chemicals and the processing time can be reduced.

Next, a description will be made of a semiconductor device manufacturing system which can switch between the wet etching processes of the first and second embodiments.

Figure 4:
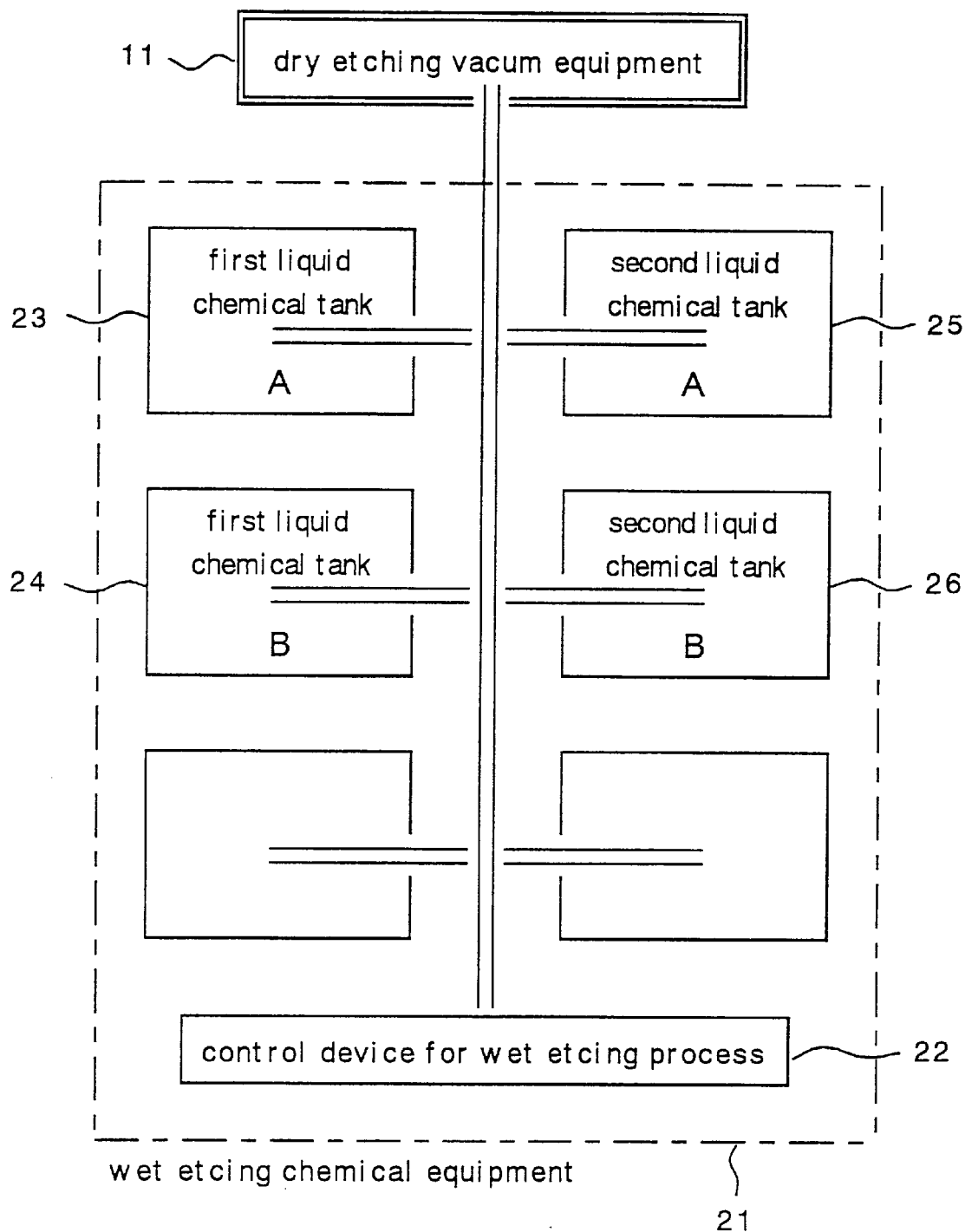
FIG. 4 shows a manufacturing system in which wet etching process and dry etching process may be switched.

FIG. 4 is for description of a manufacturing system which can switch between liquid chemicals or wet etching processes in accordance with a request for etching a subject layer.

In FIG. 4, reference numeral 11 denotes dry etching vacuum equipment, 21 denotes wet etching chemical equipment, and 22 denotes a control device for controlling liquid chemicals used in the chemical equipment and the wet etching processes. A plurality of tanks, such as first liquid chemical tanks 23 and 24 or second liquid chemical tanks 25 and 26, are provided for each of different liquid chemicals. For examples, in two tanks of the same liquid chemical, the liquid chemical is kept at different temperatures.

The control device 22 is so configured as to be able to make a control to switch between the liquid chemicals or the wet etching processes in accordance with an incoming request for etching a subject layer of a semiconductor wafer, as well as to select a liquid chemical tank that is kept at an optimum temperature for the etching request after selection of the kind of liquid chemical.

As described in the first and second embodiments, whether to remove only unnecessary reaction products or remove a resist mask together with reaction products by wet etching is determined in accordance with a request for etching a subject layer. However, in a semiconductor device manufacturing system in which steps of laminating various films on a semiconductor wafer and sequentially etching and cleaning those films are repeated, there exist many kinds of conditions among which a switching is to be made other than the conditions that have been described in the first and second embodiments. The manufacturing system of FIG. 4 which can switch between the wet etching processes is an example for performing such switching.

Although the first and second embodiments are directed to the specific case in which the subject etching layer of dry etching is a polysilicon layer, the invention is not limited to such a case. For example, the subject etching layer may be a polysilicon thin film to become the gate of a MOSFET or may be made of a material containing, as the main component, single crystal silicon, amorphous silicon, silicide, polycide, silicon oxide, silicon nitride, or silicon oxynitride. Or it may contain a III–V compound semiconductor material such as GaA.

Although the first and second embodiments are directed to the case where a hydrogen bromide gas (HBr), a bromine gas ($Br_2$), and a chlorine gas ($Cl_2$) are employed as dry etching reaction gases, the invention is not limited to such a case. For example, selection may be made from among fluorine-type gases of $CF_4$, $CHF_3$, $CH_2F_2$, and $C_2F_6$.

Reaction products that are removed by the first or second liquid chemical may be a silicon-type material containing $SiO_2$, $Si_xBr_y$, or $C_xF_ySi_z$, as the main component, or an organic material containing C (main component), H, O, and N.

The invention is advantageous in being capable of preventing deterioration in flatness or an etching failure during or after film formation, because reaction products that are produced by dry etching and adhere to a semiconductor sample are removed by cleaning with a liquid chemical containing sulfuric acid and hydrofluoric acid.

The invention is also advantageous in being capable of preventing deterioration in flatness or an etching failure during or after film formation, because a resist pattern and reaction products that are produced by dry etching and adhere to a semiconductor sample are removed by cleaning with a liquid chemical containing sulfuric acid, a hydrogen peroxide solution, and hydrofluoric acid.

Obviously many modifications and variations of the present invention are possible in the light of the above teachings. It is therefore to be understood that within the scope of the appended claims the invention may by practiced otherwise than as specifically described.

What we claim is:

1. A manufacturing method of a semiconductor device comprising the steps of:
    applying a resist pattern to a silicon-type semiconductor sample and performing dry etching on said semiconductor sample by using a reactive gas; and
    removing reaction products that have been produced by said dry etching and is adhering to said semiconductor sample by cleaning said semiconductor sample with a first liquid chemical containing sulfuric acid and hydrofluoric acid, such that the resist pattern is substantially retained.

2. The manufacturing method of a semiconductor device according to claim 1, wherein said first liquid chemical contains sulfuric acid and hydrofluoric acid at a volume mixing ratio of (5 to 7):(1/400 to 1/1000) and is kept at a temperature in the range of 25°–70° C.

3. The manufacturing method of a semiconductor device according to claim 2, wherein a material to be etched by said dry etching is selected from the group consisting of single crystal silicon, polysilicon, amorphous silicon, silicide, polycide, silicon oxide, silicon nitride, and silicon oxynitride.

4. The manufacturing method of a semiconductor device according to claim 3, wherein said reactive gas for said dry etching is a gas selected from the group consisting of HBr, $Br_2$, $Cl_2$, $CF_4$, $CHF_3$, $CH_2F_2$, and $C_2F_6$.

5. The manufacturing method of a semiconductor device according to claim 2, wherein said reactive gas for said dry etching is a gas selected from the group consisting of HBr, $Br_2$, $Cl_2$, $CF_4$, $CHF_3$, $CH_2F_2$, and $C_2F_6$.

6. The manufacturing method of a semiconductor device according to claim 1, wherein a material to be etched by said dry etching is selected from the group consisting of single crystal silicon, polysilicon, amorphous silicon, silicide, polycide, silicon oxide, silicon nitride, and silicon oxynitride.

7. The manufacturing method of a semiconductor device according to claim 6, wherein said reactive gas for said dry etching is a gas selected from the group consisting of HBr, $Br_2$, $Cl_2$, $CF_4$, $CHF_3$, $CH_2F_2$, and $C_2F_6$.

8. The manufacturing method of a semiconductor device according to claim 1, wherein said reactive gas for said dry etching is a gas selected from the group consisting of HBr, $Br_2$, $Cl_2$, $CF_4$, $CHF_3$, $CH_2F_2$, and $C_2F_6$.

9. A manufacturing method of a semiconductor device comprising the steps of:
    applying a resist pattern to a silicon-type semiconductor sample and performing dry etching on said semiconductor sample by using a reactive gas; and
    removing the resist pattern together with reaction products that have been produced by said dry etching and is adhering to said semiconductor sample by cleaning said semiconductor sample with a liquid chemical containing sulfuric acid, a hydrogen peroxide solution, and hydrofluoric acid.

10. The manufacturing method of a semiconductor device according to claim 9, wherein said second liquid chemical contains sulfuric acid, hydrogen peroxide solution, and hydrofluoric acid at a volume mixing ratio of (5 to 7):1:(1/400 to 1/1000) and is kept at a temperature in the range of 70°–100° C.

11. The manufacturing method of a semiconductor device according claim 10, wherein a material to be etched by said dry etching is selected from the group consisting of single crystal silicon, polysilicon, amorphous silicon, silicide, polycide, silicon oxide, silicon nitride, and silicon oxynitride.

12. The manufacturing method of a semiconductor device according to claim 11, wherein said reactive gas for said dry etching is a gas selected from the group consisting of HBr, $Br_2$, $Cl_2$, $CF_4$, $CHF_3$, $CH_2F_2$, and $C_2F_6$.

13. The manufacturing method of a semiconductor device according to claim 10, wherein said reactive gas for said dry etching is a gas selected from the group consisting of HBr, $Br_2$, $Cl_2$, $CF_4$, $CHF_3$, $CH_2F_2$, and $C_2F_6$.

14. The manufacturing method of a semiconductor device according to claim 9, wherein a material to be etched by said dry etching is selected from the group consisting of single crystal silicon, polysilicon, amorphous silicon, silicide, polycide, silicon oxide, silicon nitride, and silicon oxynitride.

15. The manufacturing method of a semiconductor device according claim 14, wherein said reactive gas for said dry etching is a gas selected from the group consisting of HBr, $Br_2$, $Cl_2$, $CF_4$, $CHF_3$, $CH_2F_2$, and $C_2F_6$.

* * * * *